United States Patent
Choi

(10) Patent No.: US 10,763,283 B2
(45) Date of Patent: Sep. 1, 2020

(54) ARRAY SUBSTRATE, MANUFACTURING METHOD THEREOF, DISPLAY PANEL AND MANUFACTURING METHOD THEREOF

(71) Applicant: BOE TECHNOLOGY GROUP CO., LTD., Beijing (CN)

(72) Inventor: Seungjin Choi, Beijing (KR)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 361 days.

(21) Appl. No.: 15/747,722

(22) PCT Filed: Jul. 24, 2017

(86) PCT No.: PCT/CN2017/094059
§ 371 (c)(1),
(2) Date: Jan. 25, 2018

(87) PCT Pub. No.: WO2018/040795
PCT Pub. Date: Mar. 8, 2018

(65) Prior Publication Data
US 2020/0091204 A1   Mar. 19, 2020

(30) Foreign Application Priority Data

Aug. 31, 2016   (CN) .......................... 2016 1 0797896

(51) Int. Cl.
| | |
|---|---|
| *H01L 21/00* | (2006.01) |
| *H01L 27/12* | (2006.01) |
| *G02F 1/1343* | (2006.01) |
| *G02F 1/1362* | (2006.01) |
| *G02F 1/1368* | (2006.01) |
| *H01L 29/66* | (2006.01) |
| *H01L 29/786* | (2006.01) |

(52) U.S. Cl.
CPC ........ *H01L 27/1288* (2013.01); *G02F 1/1368* (2013.01); *G02F 1/13439* (2013.01); *G02F 1/134363* (2013.01); *G02F 1/136227* (2013.01); *H01L 27/127* (2013.01); *H01L 27/1222* (2013.01); *H01L 27/1244* (2013.01); *H01L 29/66765* (2013.01); *H01L 29/78669* (2013.01); *G02F 2001/136236* (2013.01); *G02F 2202/103* (2013.01)

(58) Field of Classification Search
CPC ......... H01L 29/66765; H01L 29/78669; H01L 27/124–1244; H01L 27/1259–1296; G02F 1/134363; G02F 1/136227; G02F 2001/136236; G02F 2202/103; G02F 1/1343–13458; G02F 1/136286; G02F 2001/136295; G02F 2001/136218; G02F 2001/134318
See application file for complete search history.

(56) References Cited

U.S. PATENT DOCUMENTS

| | | |
|---|---|---|
| 2003/0016322 A1 | 1/2003 | Ha et al. |
| 2006/0138417 A1* | 6/2006 | Ahn ........................ H01L 27/12 257/59 |
| 2012/0113377 A1* | 5/2012 | Hui ....................... G02F 1/1345 349/143 |
| 2015/0064842 A1 | 3/2015 | Yang |
| 2016/0254292 A1* | 9/2016 | Shen ................... H01L 27/1259 438/104 |

FOREIGN PATENT DOCUMENTS

| | | |
|---|---|---|
| CN | 102375282 A | 3/2012 |
| CN | 102629046 A | 8/2012 |
| CN | 102707523 A | 10/2012 |
| CN | 103295961 A | 9/2013 |
| CN | 106298647 A | 1/2017 |
| WO | 2013155830 A1 | 10/2013 |

OTHER PUBLICATIONS

Search Report for International Application No. PCT/CN2017/094059 dated Sep. 28, 2017.
First Office Action for Chinese Patent Application No. 201610797896.X dated May 2, 2017.
Second Office Action for Chinese Patent Application No. 201610797896.X dated Aug. 14, 2017.
Search Report No. G1701662—Search Report for Chinese Patent Application No. 201610797896.X dated Feb. 22, 2017.

* cited by examiner

*Primary Examiner* — Calvin Y Choi
(74) *Attorney, Agent, or Firm* — Calfee, Halter & Griswold LLP

(57) ABSTRACT

A method for manufacturing the array substrate includes: forming a gate metal layer on a base by a first patterning process and forming a gate insulating layer on the gate metal layer; forming a semiconductor layer and a source/drain metal layer by a second patterning process on the resulted base, the source/drain metal layer including a data line and a metal electrode connected to the data line; forming a first electrode on the resulted base and forming a channel region by a third patterning process, the channel region causing the metal electrode to form a source electrode and a drain electrode; forming a passivation layer and an organic insulating layer by a fourth patterning process on the resulted base; the organic insulating layer at least corresponding to the data line; and forming a second electrode by a fifth patterning process on the resulted base.

11 Claims, 12 Drawing Sheets

ARRAY SUBSTRATE, MANUFACTURING METHOD THEREOF, DISPLAY PANEL AND MANUFACTURING METHOD THEREOF

CROSS REFERENCE

The present application is based upon International Application No. PCT/CN2017/094059, filed on Jul. 24, 2017, which is based upon and claims priority to Chinese Patent Application No. 201610797896.X, filed on Aug. 31, 2016, and the entire contents thereof are incorporated herein by reference.

TECHNICAL FIELD

The present disclosure relates to the field of display technology, and in particular, to an array substrate, a manufacturing method thereof, a display panel and a manufacturing method thereof.

BACKGROUND

Liquid crystal displays (LCDs) have advantages of small size, low power consumption, no radiation and so on, and occupies a dominant position in the display field.

A liquid crystal display panel in a liquid crystal display includes an array substrate, an opposite substrate and a liquid crystal layer interposed therebetween.

Currently, a manufacturing method of an array substrate with a certain structure needs to undergo six times of patterning processes using a mask plate. Specifically, the manufacturing method includes: forming a gate electrode and a gate line by a first patterning process; forming an active layer, a source electrode and a drain electrode, and a data line by a second patterning process; forming a first passivation layer and an organic insulating layer by a third patterning process; forming a first electrode by a fourth patterning process; forming a second passivation layer by a fourth patterning process, forming a second electrode by a fifth patterning process, wherein the first electrode and the second electrode are mutually the pixel electrode and the common electrode.

It should be noted that, information disclosed in the above background portion is provided only for better understanding of the background of the present disclosure, and thus it may contain information that does not form the prior art known by those ordinary skilled in the art.

SUMMARY

The embodiments of the present disclosure provide an array substrate, a manufacturing method thereof, a display panel and a manufacturing method thereof.

The embodiments of the present disclosure adopt following technical solutions.

According to a first aspect, there is provided a manufacturing method of an array substrate, including: forming a gate metal layer on a base by a first patterning process and forming a gate insulating layer on the gate metal layer; forming a semiconductor layer and a source/drain metal layer by a second patterning process on the base formed with the gate metal layer and the gate insulating layer thereon, the source/drain metal layer including a data line and a metal electrode connected to the data line; forming a first electrode on the base formed with the semiconductor layer and the source/drain metal layer thereon and forming a channel region by a third patterning process, the channel region causing the metal electrode to form a source electrode and a drain electrode; forming a passivation layer and an organic insulating layer by a fourth patterning process on the base formed with the first electrode thereon; the organic insulating layer at least corresponding to the data line; and forming a second electrode by a fifth patterning process on the base formed with the organic insulating layer thereon.

Optionally, both the first electrode and the second electrode are transparent electrodes.

Optionally, the first electrode is a common electrode, and the second electrode is a pixel electrode, the pixel electrode being electrically connected to the drain electrode at least through a via hole provided on the passivation layer; or the first electrode is a pixel electrode directly connected to the drain electrode, and the second electrode is a common electrode.

Optionally, pattern shapes of the semiconductor layer and the source/drain metal layer are identical; the forming a first electrode and forming a channel region by a third patterning process includes: forming a conductive film on the base formed with the semiconductor layer and the source/drain metal layer thereon and forming a photoresist; exposing the photoresist using a common mask plate, and developing to form a photoresist retained pattern, the photoresist retained pattern corresponding to the first electrode to be formed, the source electrode and the drain electrode to be formed, and the data line; and etching the substrate using an etching process, such that the metal electrode forms the source electrode and the drain electrode, and forming the first electrode, and simultaneously forming a retained pattern located above the data line, the source electrode and the drain electrode.

Further optionally, the semiconductor layer includes an a-si layer and an $n^+$a-si layer; the etching the substrate using an etching process, such that the metal electrode forms the source electrode and the drain electrode includes: etching the substrate using the etching process, such that the metal electrode forms the source electrode and the drain electrode and the $n^+$a-si layer forms an ohmic contact layer.

Optionally, the organic insulating layer corresponds to the data line, the source electrode and the drain electrode, and the channel region.

Further optionally, the passivation layer has a thickness of 1500~2500 Å; and the organic insulating layer has a thickness of 1.5~2.2 μm.

Optionally, the organic insulating layer is laid on the base; the organic insulating layer includes a first portion and a second portion, the first portion corresponding to the data line, the source electrode and the drain electrode, and the channel region, and the second portion corresponding to other regions; the first portion has a thickness of 1.8~2.7 μm, and the second portion has a thickness of 3000~5000 Å; and the passivation layer has a thickness of 500~1000 Å.

Further optionally, when the first electrode is a common electrode, and the second electrode is a pixel electrode, the forming a passivation layer and an organic insulating layer by a third patterning process includes: sequentially forming a passivation film and a photosensitive resin film on the base formed with the first electrode thereon; exposing the photosensitive resin film using a half-tone mask plate to form a photosensitive resin fully-retained portion, a photosensitive resin half-retained portion and a completely-removed portion; the photosensitive resin fully-retained portion corresponding to the data line, the source electrode and the drain electrode and the channel region; the photosensitive resin completely-removed portion corresponding to a via hole to be formed exposing the drain electrode; and the photosensitive resin half-retained portion corresponding to other regions; etching the passivation film using an etching process to form a passivation layer including a via hole, the via hole exposing the drain electrode; and ashing the photosensitive resin fully-retained portion and the photosensitive resin half-retained portion using an ashing process to form the organic insulating layer.

Further, the photosensitive resin fully-retained portion has a thickness of 2.0~3.0 μm; and the photosensitive resin half-retained portion has a thickness of 5000~8000 Å.

According to a second aspect, there is provided a manufacturing method of a display panel, including the manufacturing method of an array substrate according to the first aspect.

According to a third aspect, there is provided an array substrate, including: a base, a gate metal layer including a gate electrode, a gate insulating layer, a semiconductor layer, a source electrode, a drain electrode and a data line sequentially provided on the base, a channel region being formed between the source electrode and the drain electrode, the array substrate further including retained patterns respectively corresponding to and in contact with the source electrode and the drain electrode, a first electrode located in the same layer as the retained patterns, and a passivation layer, an organic insulating layer and a second electrode sequentially provided on one side of the first electrode away from the base, wherein the organic insulating layer at least corresponds to the data line.

Optionally, both the first electrode and the second electrode are transparent electrodes.

Optionally, the first electrode is a common electrode, and the second electrode is a pixel electrode, the pixel electrode being electrically connected to the drain electrode at least through a via hole provided on the passivation layer; or the first electrode is a pixel electrode directly connected to the drain electrode and the second electrode is a common electrode.

Optionally, the organic insulating layer corresponds to the data line, the source electrode and the drain electrode, and the channel region.

Further optionally, the passivation layer has a thickness of 1500~2500 Å; and the organic insulating layer has a thickness of 1.5~2.2 μm.

Optionally, the organic insulating layer is laid on the base; the organic insulating layer includes a first portion and a second portion, the first portion corresponding to the data line, the source electrode and the drain electrode, and the channel region, and the second portion corresponding to other regions; the first portion has a thickness of 1.8~2.7 μm, and the second portion has a thickness of 3000~5000 Å; and the passivation layer has a thickness of 500~1000 Å.

Based on the above, optionally, the semiconductor layer includes an a-si layer and an ohmic contact layer.

According to a fourth aspect, there is provided a display panel, including the array substrate according to the third aspect.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to more clearly illustrate the technical solutions in the embodiments of the present disclosure or in the prior art, drawings used to describe the embodiments or the prior art will be briefly described below. It will be apparent that the drawings in the following description refer only to some embodiments of the present disclosure, and other drawings are available to those of ordinal skill in the art based on these drawings without creative work.

FIG. 2b is a cross-sectional view along AA' of FIG. 2a;

FIG. 3a is a first schematic top view of forming a first electrode, a retained pattern and a channel region on the basis of FIG. 2a;

FIG. 3b is a first schematic cross-sectional view along BB' of FIG. 3a;

FIG. 3c is a second schematic cross-sectional view along BB' of FIG. 3a;

FIG. 5a is a first schematic top view of forming a passivation layer and an organic insulating layer on the basis of FIG. 3a;

FIG. 5b is a schematic cross-sectional view along CC' of FIG. 5a;

FIG. 5c is a second schematic top view of forming a passivation layer and an organic insulating layer on the basis of FIG. 3a;

FIG. 6a is a third schematic top view of forming a passivation layer and an organic insulating layer on the basis of FIG. 3a;

FIG. 6b is a schematic cross-sectional view along EE' of FIG. 6a;

FIG. 8a is a top schematic view of forming a second electrode on the basis of FIG. 5c or FIG. 6a;

FIG. 8b is a first schematic cross-sectional view along FF' of FIG. 8a;

FIG. 8c is a second schematic cross-sectional view along FF' of FIG. 8a;

FIG. 9a is a second schematic top view of forming a first electrode, a retained pattern and a channel region on the basis of FIG. 2a;

FIG. 9b is a schematic cross-sectional view along GG' of FIG. 9a;

REFERENCE NUMERALS

Figure 1A:
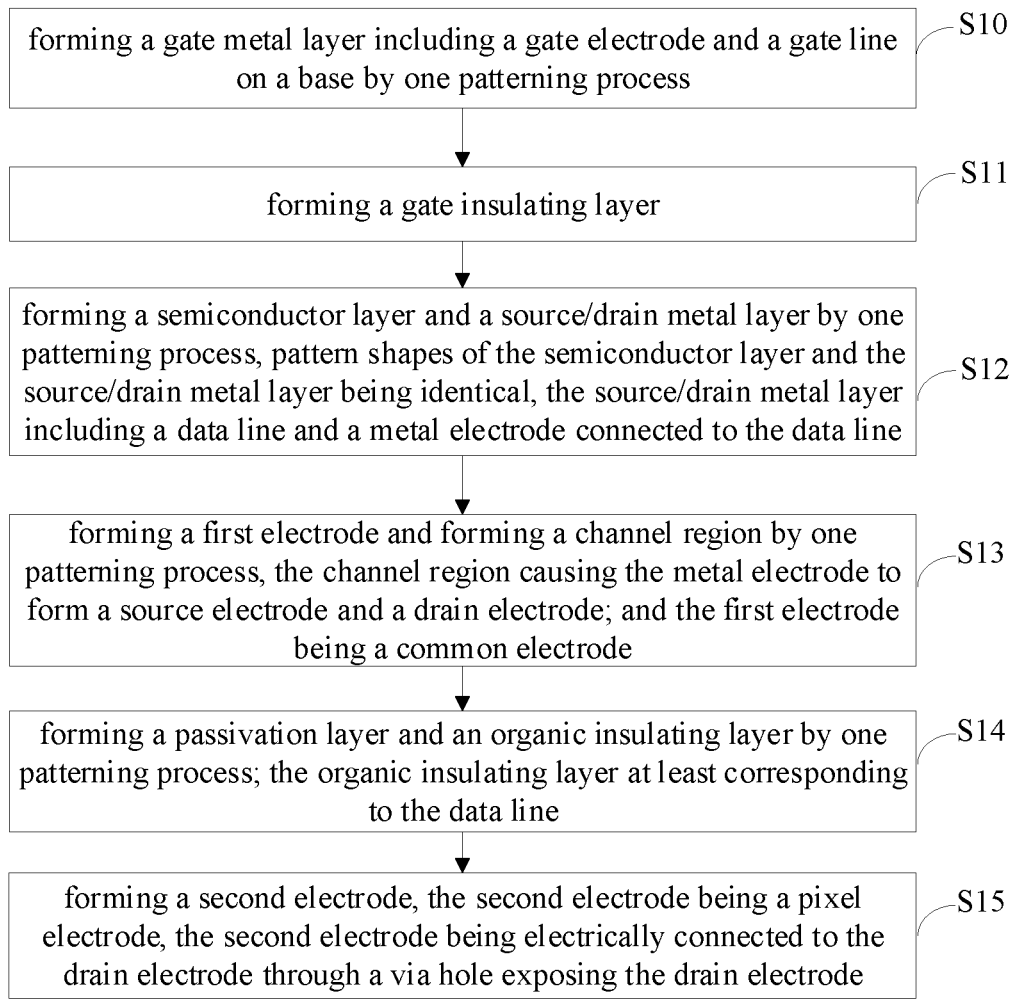
FIG. 1a is a first schematic flow diagram of a manufacturing method of an array substrate according to an embodiment of the present disclosure.

01—Base; 02—Common mask plate; 03—Halftone mask plate; 10—Gate metal layer; 101—Gate electrode; 102—Gate line; 11—Gate insulating layer; 12—Semiconductor layer; 121—a-si Layer; 122—Ohmic contact layer; 13—Source/drain metal layer; 131—Data line; 132—Metal electrode; 1321—Source electrode; 1322—Drain electrode; 14—Conductive film; 141—First electrode; 142—Retained pattern; 15—Photoresist; 151—Photoresist retained pattern; 16—Passivation film; 161—Passivation layer; 162—Via hole; 17—Photosensitive resin film; 171—Organic insulating layer; 172—Photosensitive resin completely retained portion; 173—Photosensitive resin half-retained portion; 174—Photosensitive resin completely removed portion; 18—Second electrode.

DETAILED DESCRIPTION

The technical solutions of the embodiments of the present disclosure will be described clearly and completely in conjunction with the accompanying drawings of the embodiments of the present disclosure. It is obvious that the described embodiments are only part of the embodiments rather than all embodiments of the present disclosure. All other embodiments obtained by one of ordinary skill in the art based on the described embodiments of the present disclosure without creative work are within the protection scope of the present disclosure.

An embodiment of the present disclosure provides a manufacturing method of an array substrate, including: forming a gate metal layer on a base by one patterning process and forming a gate insulating layer on the gate metal layer; forming a semiconductor layer and a source/drain metal layer by one patterning process on a base on which the gate metal layer and the gate insulating layer are formed, the source/drain metal layer including a data line and a metal electrode connected to the data line; forming a first electrode on a base on which the semiconductor layer and the source/drain metal layer are formed and forming a channel region by one patterning process, the channel region causing the metal electrode to form a source electrode and a drain electrode; forming a passivation layer and an organic insulating layer by one patterning process on a base on which the first electrode is formed; the organic insulating layer at least corresponding to the data line; and forming a second electrode by one patterning process on a base on which the organic insulating layer is formed.

It should be noted that, firstly, the gate metal layer may include a gate electrode and a gate line. A gate insulating layer is also formed after the gate metal layer is formed and before the semiconductor layer is formed.

Secondly, material of the semiconductor layer is not limited. The semiconductor layer may be an organic semiconductor layer or a metal oxide semiconductor layer. Of course, it may further include an a-si (amorphous silicon) layer, an n+a-si layer and so on.

Thirdly, when a channel region is formed, it may be determined whether to etch the corresponding semiconductor layer or not according to the material of the semiconductor layer. For example, when the semiconductor layer includes an a-si layer and an n+a-si layer, the n+a-si layer is required to be etched, and the a-si layer may also be properly over-etched.

Fourthly, the organic insulating layer at least corresponds to the data line. In one case, the organic insulating layer corresponds to the data line only. In the other case, the organic insulating layer corresponds to not only the data line but also to other regions.

The embodiments of the present disclosure provide a manufacturing method of an array substrate, including: forming a gate metal layer including a gate electrode by a first patterning process, forming a semiconductor layer and a source/drain metal layer including a data line and a metal electrode by a second patterning process; forming a first electrode and forming a channel region by a third patterning process; forming a passivation layer and an organic insulating layer by a fourth patterning process; and forming a second electrode by a fifth patterning process. Compared with six times of patterning processes in the prior art, the manufacturing method of an array substrate in the embodiments of the present disclosure is reduced by one time of patterning process, which may reduce the cost.

Optionally, both the first electrode and the second electrode are transparent electrodes.

Further optionally, the first electrode is a common electrode; the second electrode is a pixel electrode, the pixel electrode being electrically connected to the drain electrode at least through a via hole provided on the passivation layer.

Alternatively, the first electrode is a pixel electrode, the pixel electrode being directly connected to the drain electrode; and the second electrode is a common electrode.

The first embodiment, as shown in FIG. 1a, provides a manufacturing method of an array substrate, which includes following steps.

Figure 2A:
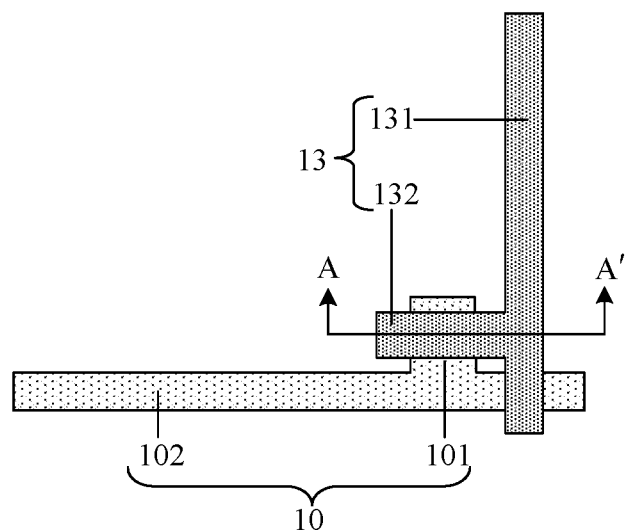
FIG. 2a is a top schematic view of forming a gate metal layer, a semiconductor layer and a source/drain metal layer on a base according to an embodiment of the present disclosure.
Figure 2B:
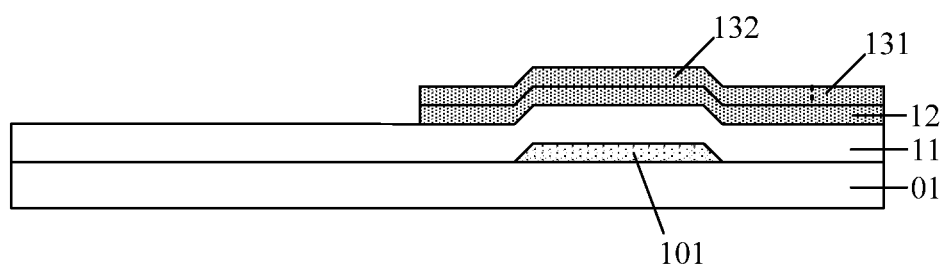

S10, as shown in FIGS. 2a and 2b, a gate metal layer 10 including a gate electrode 101 and a gate line 102 is formed on a base 01 by one patterning process, e.g., a first patterning process.

Specifically, a metal film may be prepared on the base 01 in advance. Generally, the metal material may include molybdenum, aluminum, aluminum-nickel alloy, molybdenum-tungsten alloy, chromium, copper or other metal, or a combination thereof. Then, the gate electrode 101 and the gate line 102 are formed on the base 01 through patterning processes such as exposure, development, etching, stripping and the like using a common mask plate.

S11, as shown in FIG. 2b, on the basis of S10, a gate insulating layer 11 is formed.

Specifically, an insulating film may be formed on the base 01 with the gate electrode 101 formed thereon, to form a gate insulating layer 11. The material of the gate insulating layer 11 is usually silicon nitride, silicon oxide, silicon oxynitride and the like.

S12, as shown in FIGS. 2a and 2b, on the basis of S11, a semiconductor layer 12 and a source/drain metal layer 13 are formed by one patterning process. Pattern shapes of the semiconductor layer 12 and the source/drain metal layer 13 are identical. The source/drain metal layer 13 includes a data line 131 and a metal electrode 132 connected to the data line 131.

Specifically, a semiconductor film and a metal film are sequentially formed on the gate insulating layer 11 and a photoresist is formed. Afterwards, the photoresist is exposed using the common mask plate and developed. After being etched, the semiconductor layer 12 and the source/drain metal layer 13 are formed.

In the embodiment, generally, the material of the metal film may include molybdenum, aluminum, aluminum-nickel alloy, molybdenum-tungsten alloy, chromium, copper or other metal, or a combination thereof. The semiconductor film may include a single layer or multiple layers, which depends on a structure of the thin film transistor to be formed.

Figure 3A:
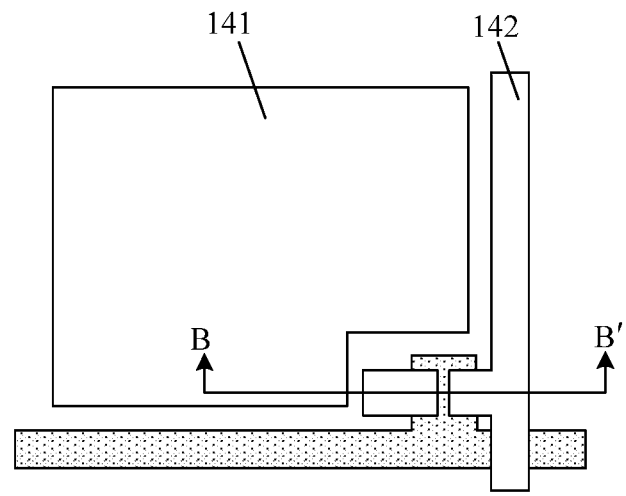
Figure 3B:
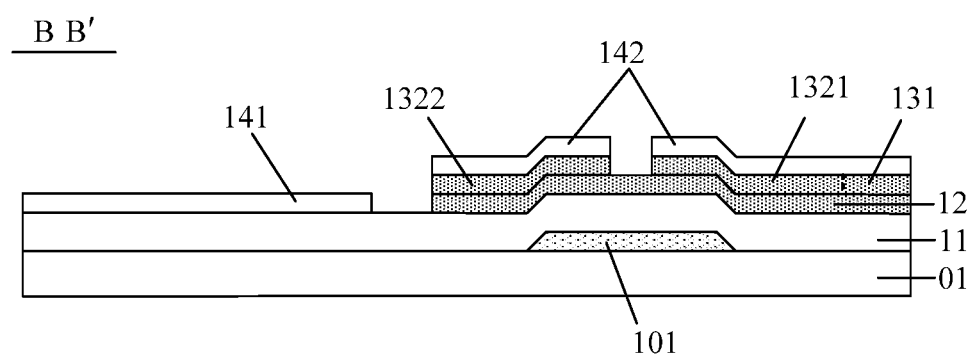

S13, as shown in FIGS. 3a and 3b, on the basis of S12, a first electrode 141 is formed and a channel region is formed by one patterning process, the channel region causing the metal electrode 132 to form a source electrode 1321 and a drain electrode 1322; and the first electrode 141 is a common electrode.

Figure 4A:
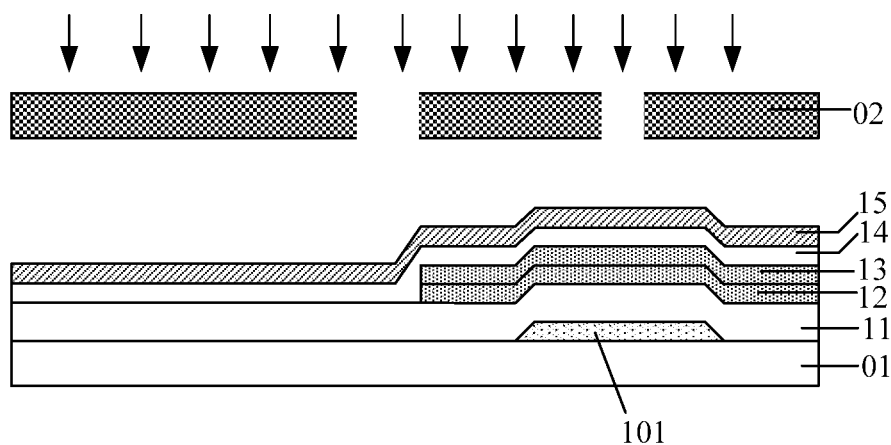
FIGS. 4a-4c are schematic diagrams of a process of forming a first electrode, a retained pattern and a channel region according to an embodiment of the present disclosure.
Figure 4B:
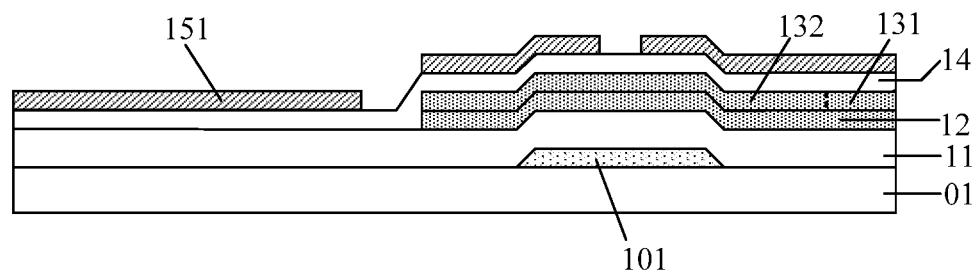
Figure 4C:
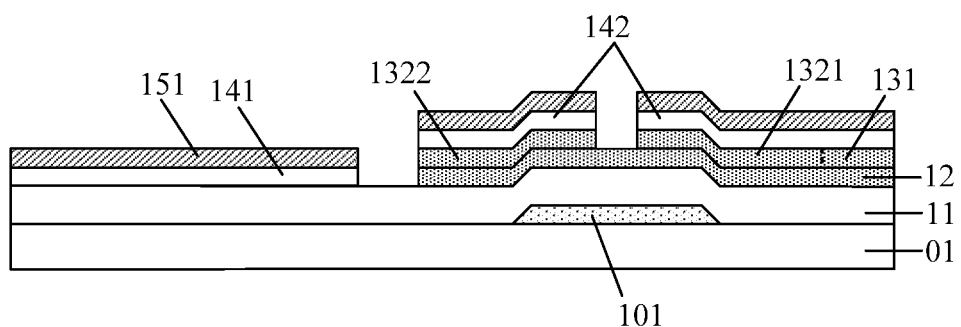

Specifically, as shown in FIG. 4a, a conductive film 14 may be formed on the substrate on which the source/drain metal layer 13 is formed. The material of the conductive film 14 may be ITO (Indium Tin Oxide) or IZO (Indium Zinc Oxide) or the like, and a photoresist 15 is formed. Afterwards, the photoresist 15 is exposed using a common mask plate 02. After being developed, as shown in FIG. 4b, a photoresist retained pattern 151 is formed, the photoresist retained pattern 151 corresponds to the first electrode 141 to be formed, the source electrode and the drain electrode to be formed, and the data line 131. Afterwards, as shown in FIG. 4c, the substrate is etched using an etching process, such that the metal electrode 132 forms the source electrode 1321 and the drain electrode 1322, and the first electrode 141 is formed, and a retained pattern 142 located above the data line 131, the source electrode 1321 and the drain electrode 1322 are simultaneously formed. Finally, the photoresist retained pattern 151 is removed to form a structure as shown in FIG. 3b.

Figure 3C:
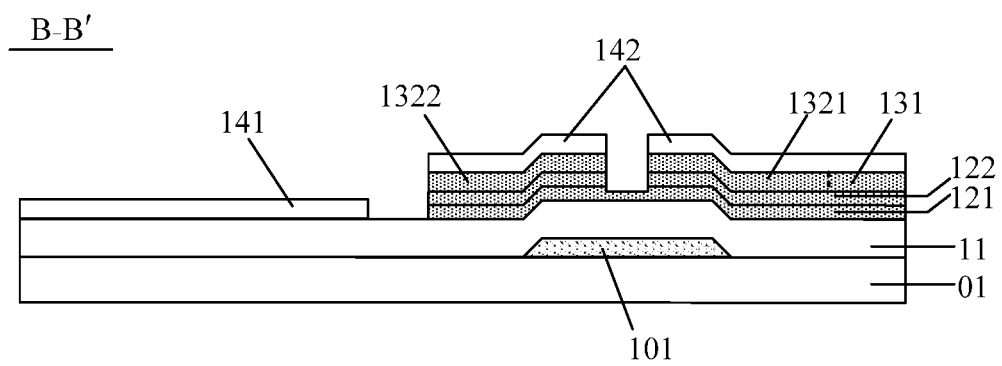

In the embodiment, as shown in FIG. 3c, in the case when the semiconductor layer 12 includes the a-si layer 121 and the n+a-si layer, the n+a-si layer may be continuously etched while the source electrode 1321 and the drain electrode 1322 is formed by etching, such that the n+a-si layer forms an ohmic contact layer 122.

Herein, when the ohmic contact layer 122 is formed, the a-si layer 121 may be properly over-etched, so as to prevent conductive ions adhered to a surface of the a-si layer 121 from penetrating into the channel and affecting the performance of the thin film transistor. In this case, the thin film transistor includes: the gate electrode 101, the gate insulating layer 11, the a-si layer 121, the ohmic contact layer 122, the source electrode 1321, and the drain electrode 1322.

S14, as shown in FIGS. 5a-5b and FIGS. 6a and 6b, on the basis of S13, a passivation layer 161 and an organic insulating layer 171 are formed by one patterning process. The organic insulating layer 171 at least corresponds to the data line 131.

Herein, the organic insulating layer 171 is optionally an organic resin layer. Further optionally, the material of the organic insulating layer 171 is the photosensitive resin material.

Specifically, the following three cases are described in detail.

Figure 5A:
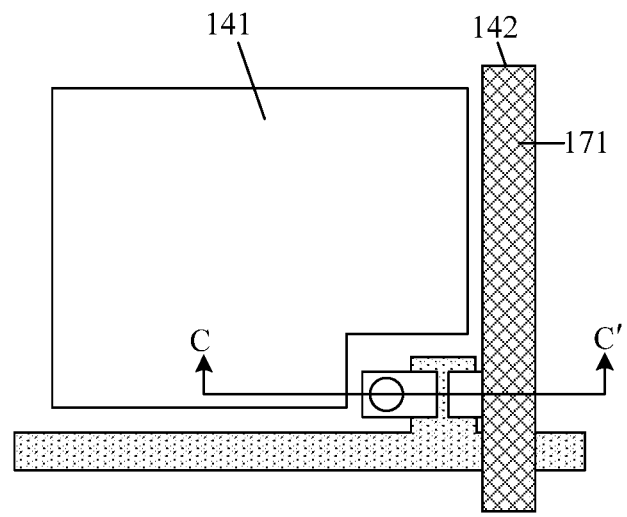
Figure 5B:
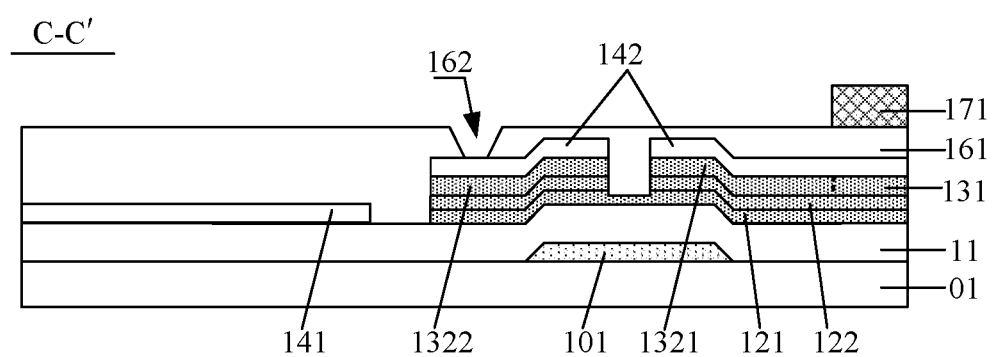

The first case: as shown in FIGS. 5a and 5b, the organic insulating layer 171 may correspond to only the data line 131. Based on this, optionally, the passivation layer 161 has a thickness of 1500~2500 Å and the organic insulating layer 171 has a thickness of 1.5~2.2 μm.

In this case, the array substrate may be applied in a product with a high Cst (storage capacitance). For example, in a high-resolution product, the pixel area is small, resulting in smaller Cst. The Vop (driving voltage) has a correlation with the Cst, which needs to be in accordance with product specifications for optimal design. However, in the embodiment of the present disclosure, no organic insulating layer is formed in the pixel region and the thickness of the passivation layer 161 is 1500~2500 Å, which may increase the Cst. In this way, the Vop will also meet the design requirements, and thus may be applied to the high-resolution product. In addition, the thickness of the passivation layer 161 is set to be 1500~2500 Å, which may also avoid a short circuit between the common electrode and the pixel electrode.

Figure 5C:
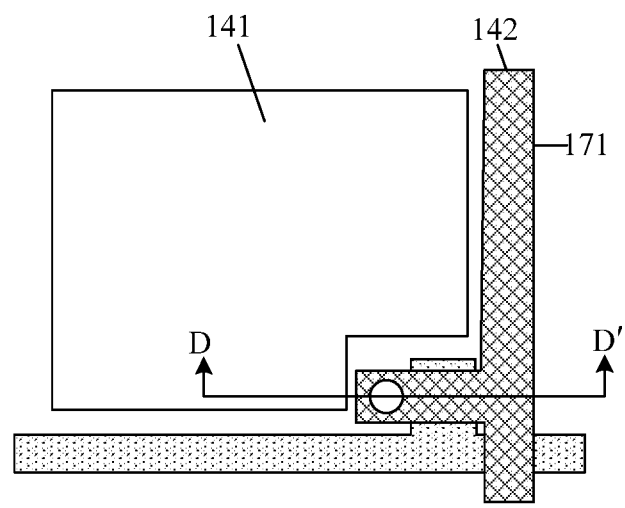
Figure 5D:
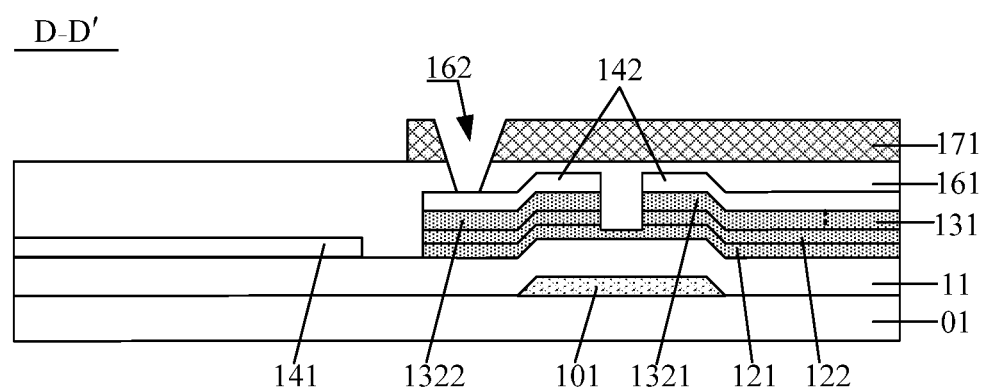
FIG. 5d is a schematic cross-sectional view along DD' of FIG. 5c.

The second case: as shown in FIGS. 5c and 5d, the organic insulating layer 171 may correspond to the data line 131, the source electrode 1321 and the drain electrode 1322, and the channel region. That is, the organic insulating layer 171 not only corresponds to the data line 131, but also corresponds to the thin film transistor. Based on this, optionally, the passivation layer 161 has a thickness of 1500~2500 Å and the organic insulating layer 171 has a thickness of 1.5~2.2 μm.

In this case, the array substrate may be applied to products with high Cst.

Figure 6A:
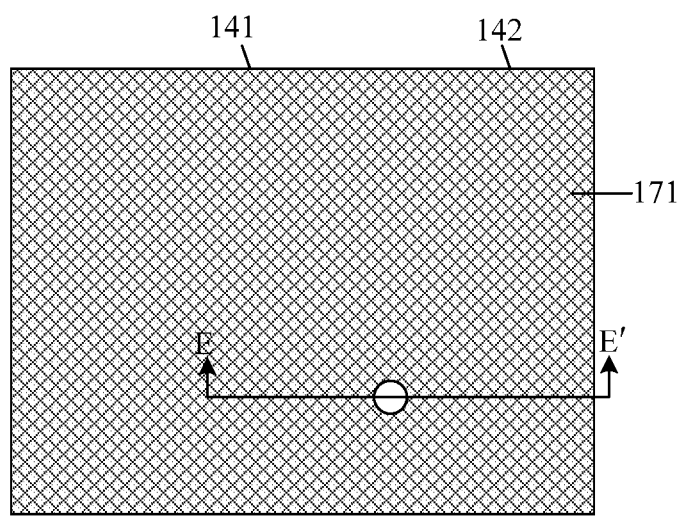
Figure 6B:
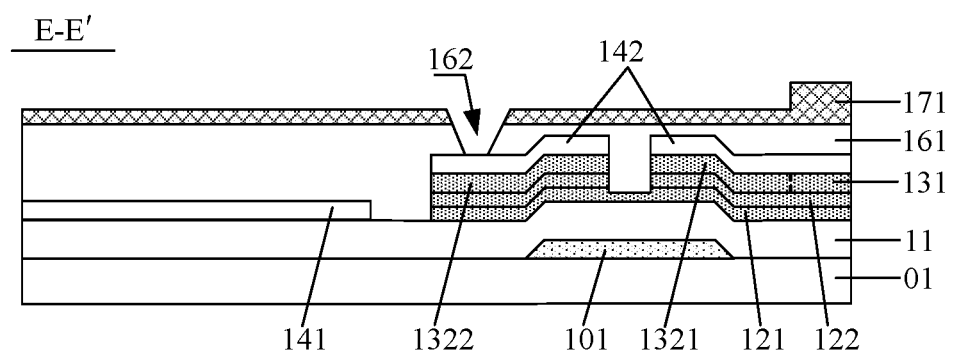

The third case: as shown in FIGS. 6a and 6b, the organic insulating layer 171 is laid on the base 01, e.g. formed over the base 01. At this time, the organic insulating layer 171 may include a first portion and a second portion. The first portion corresponds to the data line 131, the source electrode 1321 and the drain electrode 1322, and the channel region. The second portion corresponds to other regions. In the embodiment, if a thickness of the second portion is too large, the storage capacitance Cst of the array substrate will be too small. Therefore, the thickness of the second portion is smaller than that of the first portion.

Based on this, optionally, the first portion has a thickness of 1.8~2.7 μm, the second portion has a thickness of 3000~5000 Å, and the passivation layer has a thickness of 500~1000 Å.

In this case, the array substrate may be applied in a product with reduced Cst. For example, in a low-resolution product such as a TV (Television) product, the pixel area becomes large and Cst becomes excessively large. Thus, the embodiments of the present disclosure may reduce the Cst by forming the organic insulating layer 171 in the pixel area and making the thickness of the passivation layer 161 to be 500~1000 Å. In addition, the organic insulating layer 171 is also formed in the pixel region, such that the entire array substrate may be more flattened.

Figure 7A:
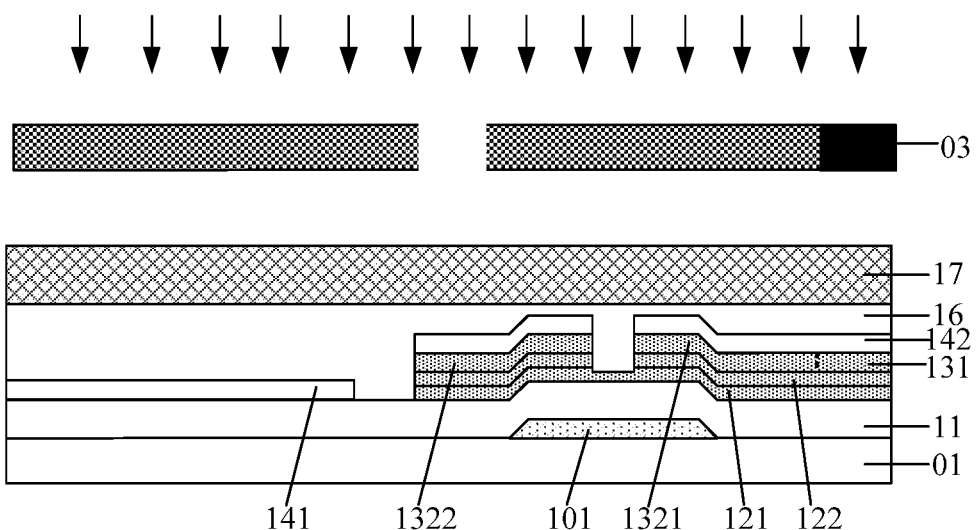
FIGS. 7a-7c are schematic views of a process of forming a passivation layer and an organic insulating layer according to an embodiment of the present disclosure.
Figure 7B:
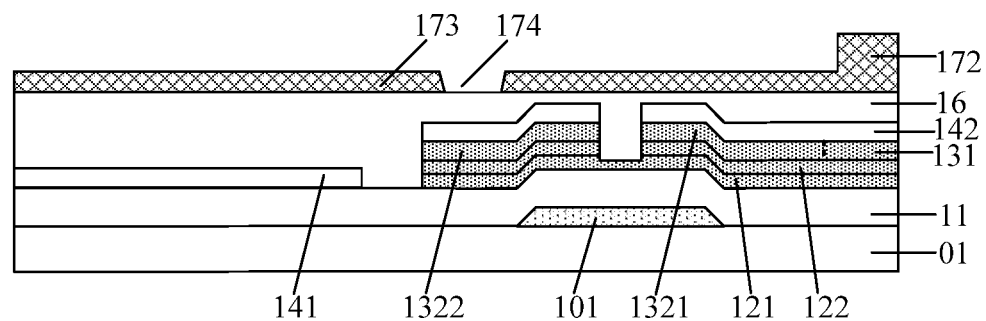
Figure 7C:
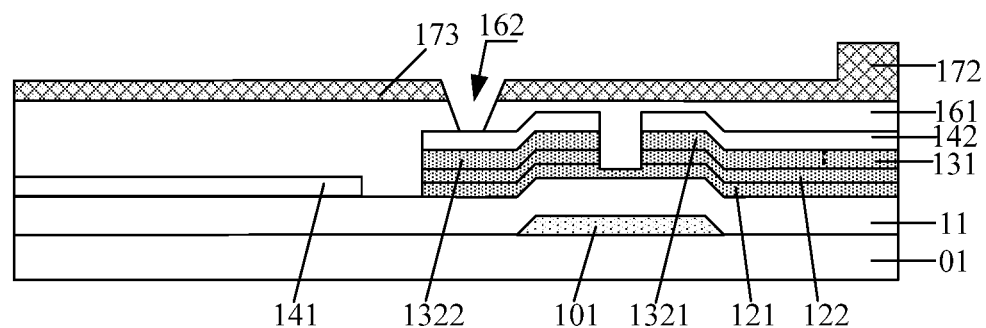

In the embodiment, with respect to the cases as shown in FIGS. 5c and 5d, as shown in FIG. 7a, the passivation film 16 may be formed on the substrate on which the first electrode 141 and the retained pattern 142 are formed, and a photosensitive resin film 17 is formed. Afterwards, the photosensitive resin film 17 is exposed using the halftone mask plate 03. After development, as shown in FIG. 7b, a photosensitive resin fully-retained portion 172, a photosensitive resin half-retained portion 173 and a photosensitive resin completely-removed portion 174 are formed. The photosensitive resin fully-retained portion 172 corresponds to the data line 131, the source electrode 1321 and the drain electrode 1322 and the channel region. The photosensitive resin completely-removed portion 174 corresponds to a via hole to be formed exposing the drain electrode 1322. The photosensitive resin half-retained portion corresponds to other regions. As shown in FIG. 7c, the passivation film 16 is etched using an etching process to form a passivation layer 161 including a via hole 162. Then, the photosensitive resin half-retained portion 173 is removed using an ashing process. Since the thickness of the photosensitive resin fully-retained portion 172 is greater than that of the photosensitive resin half-retained portion 173, a part of the thickness of the photosensitive resin fully-retained portion 172 is retained, to form the organic insulating layer 171 as shown in FIG. 5d.

Optionally, the photosensitive resin fully-retained portion has a thickness of 2.0~3.0 μm; and the photosensitive resin half-retained portion 173 has a thickness of 5000~8000 Å. Thus, on one hand, the portion of the organic insulating layer 171 corresponding to the data line 131 may meet the product design requirement, and on the other hand, the product design requirement may also be met when a part of the thickness of the photosensitive resin half-retained portion 173 is retained.

The cases as shown in FIGS. 5a and 5b are similar to the above process, except that the photosensitive resin completely-retained portion 172 corresponds to only the data line 131.

The cases as shown in FIGS. 6a and 6b are similar to the above process, except that in the ashing process, the photosensitive resin completely-retained portion 172 may not be removed but only a portion of the thickness may be removed to form the organic insulating layer 171 as shown in FIG. 6b.

Figure 8A:
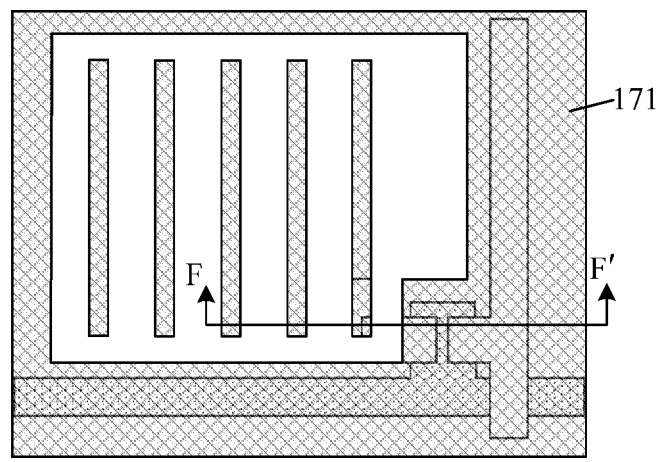
Figure 8B:
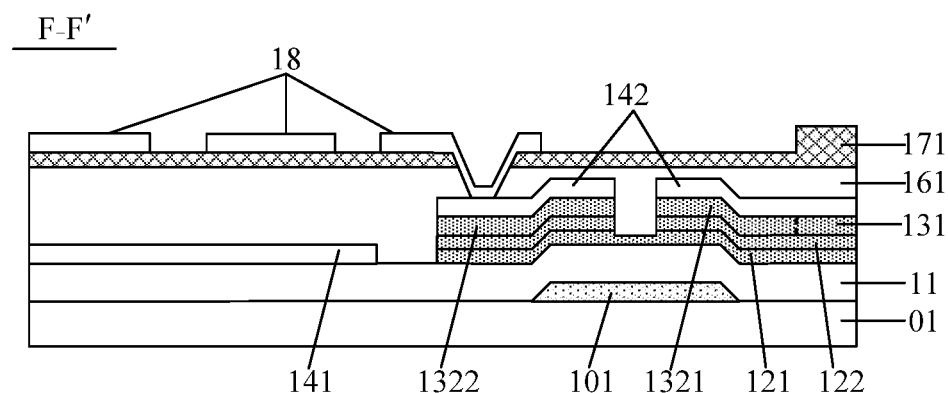
Figure 8C:
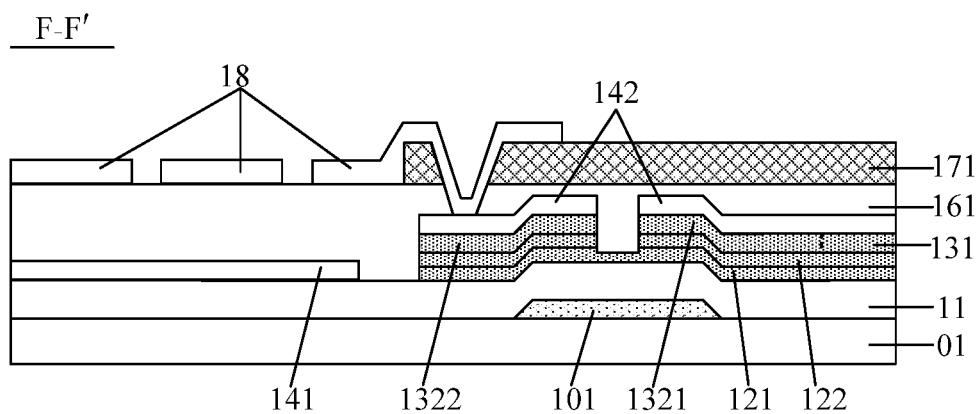

S15, as shown in FIGS. 8a, 8b and 8c, on the basis of S14, a second electrode 18 is formed, the second electrode 18 is a pixel electrode. The second electrode 18 is electrically connected to the drain electrode 1322 through a via hole 162 exposing the drain electrode 1322.

Specifically, a transparent conductive film may be formed on the substrate having the organic insulating layer 171 formed thereon. Then, the second electrode 18 may be formed by patterning processes such as exposure, development, etching, stripping and the like using a common mask plate.

Figure 1B:
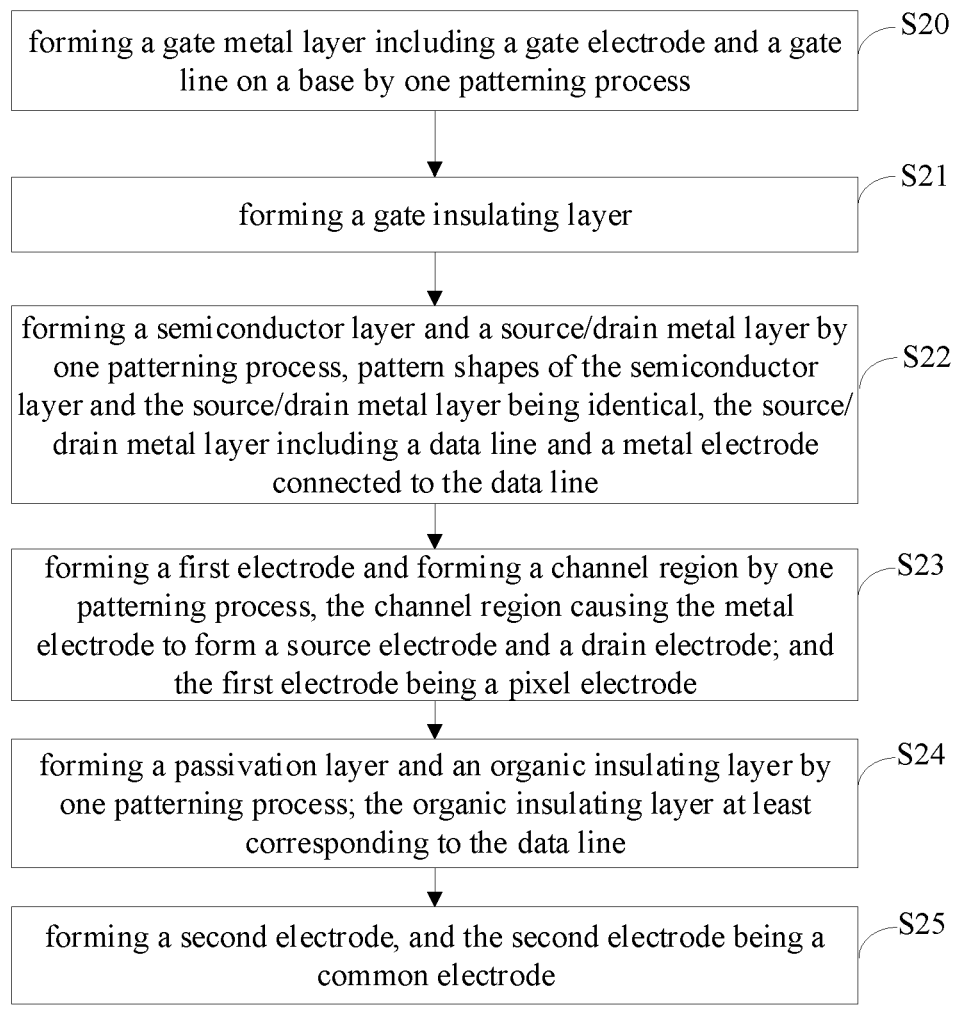
FIG. 1b is a second schematic flow diagram of a manufacturing method of an array substrate according to an embodiment of the present disclosure.

The second embodiment, as shown in FIG. 1b, provides a manufacturing method of an array substrate, which includes following steps.

S20, as shown in FIGS. 2a and 2b, a gate metal layer 10 including a gate electrode 101 and a gate line 102 is formed on a base 01 by one patterning process.

S21, as shown in FIG. 2b, on the basis of S20, a gate insulating layer 11 is formed.

S22, as shown in FIGS. 2a and 2b, on the basis of S21, a semiconductor layer 12 and a source/drain metal layer 13 are formed by one patterning process. Pattern shapes of the semiconductor layer 12 and the source/drain metal layer 13 are identical. The source/drain metal layer 13 includes a data line 131 and a metal electrode 132 connected to the data line 131.

Figure 9A:
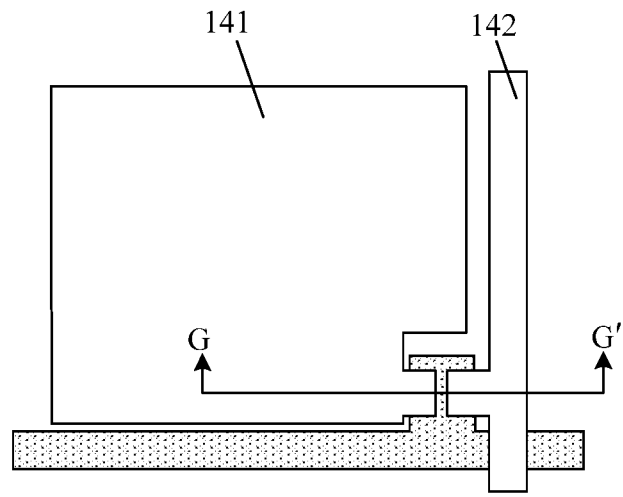
Figure 9B:
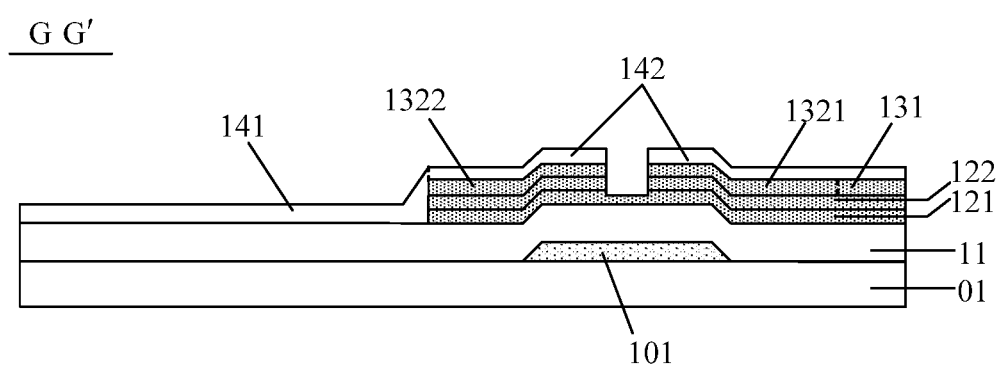

S23, as shown in FIGS. 9a and 9b, on the basis of S22, a first electrode 141 is formed and a channel region is formed by one patterning process, the channel region causing the metal electrode 132 to form a source electrode 1321 and a drain electrode 1322; and the first electrode 141 is a pixel electrode.

Herein, a retained pattern 142 above the data line 131, the source electrode 1321 and the drain electrode 1322 is also formed while the first electrode 141 is formed. The retained pattern 142 above the drain 1322 is connected to the first electrode 141.

As shown in FIG. 9b, in the case when the semiconductor layer 12 includes the a-si layer 121 and the n+a-si layer, the n+a-si layer may be continuously etched while the source electrode 1321 and the drain electrode 1322 is formed by etching, such that the n+a-si layer forms an ohmic contact layer 122.

In the embodiment, when the ohmic contact layer 122 is formed, the a-si layer 121 may be properly over-etched, so as to prevent conductive ions adhered to a surface of the a-si layer 121 from penetrating into the channel and affecting the performance of the thin film transistor. In this case, the thin film transistor includes: the gate electrode 101, the gate insulating layer 11, the a-si layer 121, the ohmic contact layer 122, the source electrode 1321, and the drain electrode 1322.

Figure 10A:
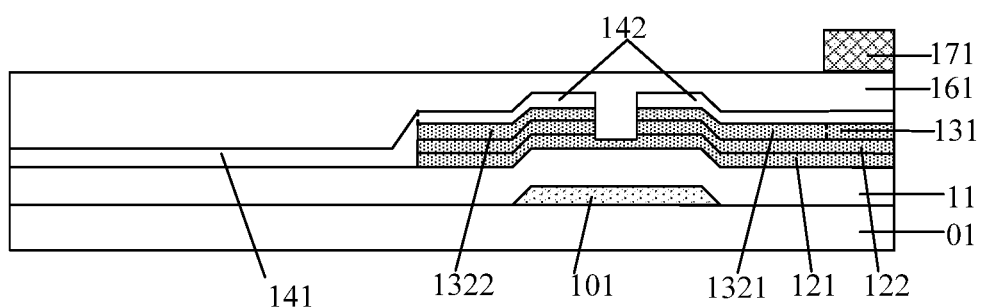
FIG. 10a is a first schematic view of forming a passivation layer and an organic insulating layer on the basis of FIG. 9b.
Figure 10B:
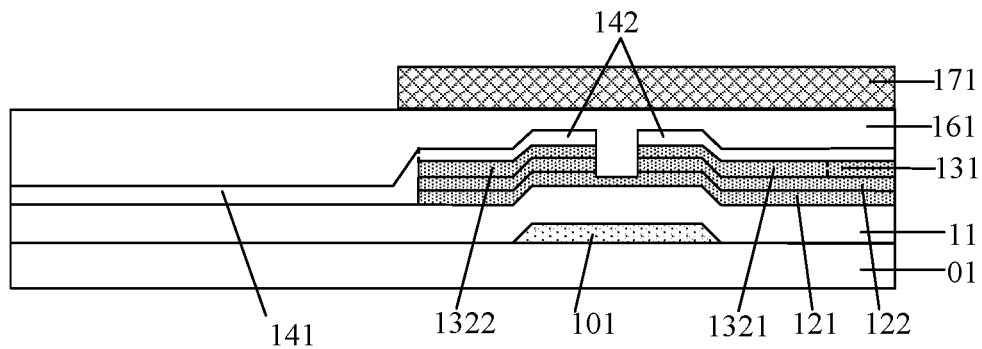
FIG. 10b is a second schematic diagram of forming a passivation layer and an organic insulating layer on the basis of FIG. 9b.
Figure 10C:
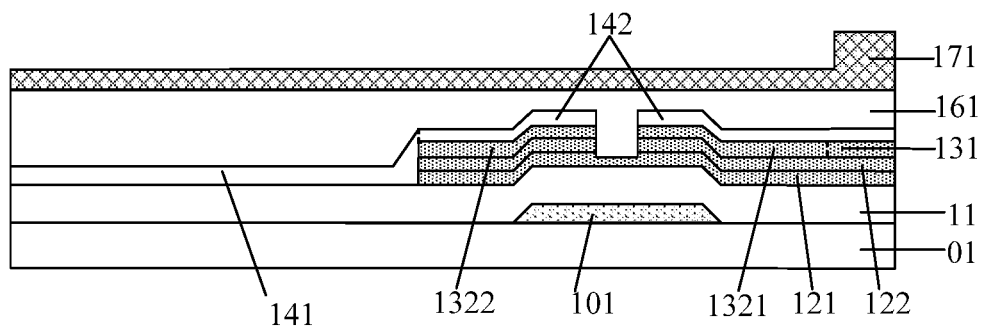
FIG. 10c is a third schematic diagram of forming a passivation layer and an organic insulating layer on the basis of FIG. 9b.

S24, as shown in FIGS. 10a-10c, on the basis of S23, a passivation layer 161 and an organic insulating layer 171 are formed by one patterning process. The organic insulating layer 171 at least corresponds to the data line 131.

Herein, the organic insulating layer 171 is optionally an organic resin layer. Further optionally, the material of the organic insulating layer 171 is the photosensitive resin material.

Specifically, the following three cases are described in detail.

The first case: as shown in FIG. 10a, the organic insulating layer 171 may correspond to only the data line 131. Based on this, optionally, the passivation layer 161 has a thickness of 1500~2500 Å and the organic insulating layer 171 has a thickness of 1.5~2.2 μm.

In this case, the array substrate may be applied in a product with a high Cst. For example, in a high-resolution product, the pixel area is small, resulting in smaller Cst. The Vop has a correlation with the Cst, which needs to be in accordance with product specifications for optimal design. However, in the embodiment of the present disclosure, no organic insulating layer is formed in the pixel region and the thickness of the passivation layer 161 is 1500~2500 Å, which may increase the Cst. In this way, the Vop will also meet the design requirements, and thus may be applied to the high-resolution product. In addition, the thickness of the passivation layer 161 is set to be 1500~2500 Å, which may also avoid a short circuit between the common electrode and the pixel electrode.

The second case: as shown in FIG. 10b, the organic insulating layer 171 may correspond to the data line 131, the source electrode 1321 and the drain electrode 1322, and the channel region. That is, the organic insulating layer 171 not only corresponds to the data line 131, but also corresponds to the thin film transistor. Based on this, optionally, the passivation layer 161 has a thickness of 1500~2500 Å and the organic insulating layer 171 has a thickness of 1.5~2.2 μm.

In this case, the array substrate may be applied to products with high Cst.

The third case: as shown in FIG. 10c, the organic insulating layer 171 is laid on the base 01. At this time, the organic insulating layer 171 may include a first portion and a second portion. The first portion corresponds to the data line 131, the source electrode 1321 and the drain electrode 1322, and the channel region. The second portion corresponds to other regions. In the embodiment, if a thickness of the second portion is too large, the storage capacitance Cst of the array substrate will be too small. Therefore, the thickness of the second portion is smaller than that of the first portion.

Based on this, optionally, the first portion has a thickness of 1.8~2.7 μm, the second portion has a thickness of 3000~5000 Å, and the passivation layer 161 has a thickness of 500~1000 Å.

In this case, the array substrate may be applied in a product with reduced Cst. For example, in a low-resolution product such as a TV product, the pixel area becomes large and Cst becomes excessively large. Thus, the embodiments of the present disclosure may reduce the Cst by forming the organic insulating layer 171 in the pixel area and making the thickness of the passivation layer 161 to be 500~1000 Å. In addition, the organic insulating layer 171 is also formed in the pixel region, such that the entire array substrate may be more flattened.

Figure 11:
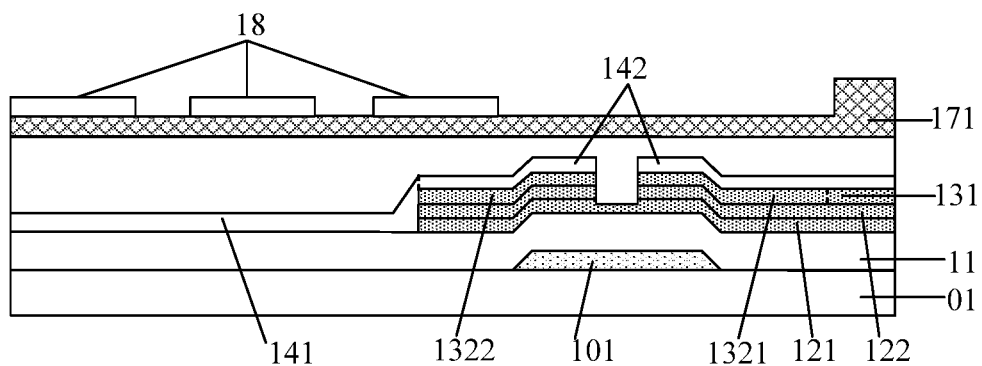
FIG. 11 is a schematic diagram of forming a second electrode on the basis of FIG. 10c.

S25, as shown in FIG. 11, on the basis of S24, a second electrode 18 is formed, and the second electrode 18 is a common electrode.

The embodiments of the present disclosure further provide a manufacturing method of a display panel, including the manufacturing method of an array substrate described above.

The embodiments of the present disclosure provide a manufacturing method of an array substrate. When the array substrate is prepared, a gate metal layer including a gate electrode is formed by a first patterning process, a semiconductor layer and a source/drain metal layer including a data line and a metal electrode is formed by a second patterning process; a first electrode is formed and a channel region is formed by a third patterning process; a passivation layer and an organic insulating layer are formed by a fourth patterning process; and a second electrode is formed by a fifth patterning process. Compared with six times of patterning processes in the prior art, the manufacturing method of an array substrate in the embodiments of the present disclosure is reduced by one time of patterning process, which may reduce the cost.

As shown in FIGS. 8b, 8c and 11, the embodiments of the present disclosure further provide an array substrate including: a base 01, a gate metal layer including a gate electrode 101, a gate insulating layer 11, a semiconductor layer, a source electrode 1321, a drain electrode 1322 and a data line 131 sequentially provided on the base 01, a channel region being formed between the source electrode 1321 and the drain electrode 1322, the array substrate further including retained patterns 142 respectively corresponding to and in contact with the source electrode 1321 and the drain electrode 1322, a first electrode 141 located in the same layer as the retained patterns 142, and a passivation layer 161, an organic insulating layer 171 and a second electrode 18 sequentially provided on one side of the first electrode 141 away from the base 01, wherein the organic insulating layer 171 at least corresponds to the data line 131.

Optionally, the semiconductor layer includes an a-si layer 121 and an ohmic contact layer 122.

In this case, the thin film transistor includes: the gate electrode 101, the gate insulating layer 11, the a-si layer 121, the ohmic contact layer 122, the source electrode 1321 and the drain electrode 1322.

Optionally, both the first electrode 141 and the second electrode 18 are transparent electrodes.

Further optionally, as shown in FIGS. 8b and 8c, the first electrode 141 is a common electrode; the second electrode 18 is a pixel electrode, the pixel electrode being electrically connected to the drain electrode 1322 at least through a via hole 162 provided on the passivation layer 161.

Alternatively, as shown in FIG. 11, the first electrode 141 is a pixel electrode, the pixel electrode being directly connected to the drain electrode 1322; and the second electrode 18 is a common electrode.

Based on the above, optionally, as shown in FIG. 8c, the organic insulating layer 171 corresponds to the data line 131, the source electrode 1321 and the drain electrode 1322, and the channel region. At this time, the pixel electrode is electrically connected to the drain electrode 1322 through the via hole 162 provided on the passivation layer 161.

Based on the above, optionally, the passivation layer 161 has a thickness of 1500~2500 Å; and the organic insulating layer 171 has a thickness of 1.5~2.2 μm.

In this case, the array substrate may be applied in a product with a high Cst. For example, in a high-resolution product, the pixel area is small, resulting in smaller Cst. The Vop has a correlation with the Cst, which needs to be in accordance with product specifications for optimal design. However, in the embodiment of the present disclosure, no organic insulating layer is formed in the pixel region and the thickness of the passivation layer 161 is 1500~2500 Å, which may increase the Cst. In this way, the Vop will also meet the design requirements, and thus may be applied to the high-resolution product. In addition, the thickness of the passivation layer 161 is set to be 1500~2500 Å, which may also avoid a short circuit between the common electrode and the pixel electrode.

Of course, referring to FIGS. 5a and 5b, the organic insulating layer 171 may correspond to only the data line 131.

As shown in FIG. 8b, the organic insulating layer 171 is laid on the base 01. The organic insulating layer 171 may include a first portion and a second portion. The first portion corresponds to the data line 131, the source electrode 1321 and the drain electrode 1322, and the channel region. The second portion corresponds to other regions. At this time, the pixel electrode is electrically connected to the drain electrode 1322 through the via hole 162 provided on the passivation layer 161 and the organic insulating layer 171.

Based on the above, optionally, the first portion has a thickness of 1.8~2.7 μm, and the second portion has a thickness of 3000~5000 Å; and the passivation layer has a thickness of 500~1000 Å.

In this case, the array substrate may be applied in a product with reduced Cst. For example, in a low-resolution product such as a TV product, the pixel area becomes large and Cst becomes excessively large. Thus, the embodiments of the present disclosure may reduce the Cst by forming the organic insulating layer 171 in the pixel area and making the thickness of the passivation layer 161 to be 500~1000 Å. In addition, the organic insulating layer 171 is also formed in the pixel region, such that the entire array substrate may be more flattened.

The embodiments of the present disclosure provide an array substrate. A gate metal layer including a gate electrode is formed by a first patterning process. A semiconductor layer and a source/drain metal layer including a data line and a metal electrode are formed by a second patterning process. A first electrode is formed and a channel region is formed by a third patterning process. A passivation layer and an organic insulating layer are formed by a fourth patterning process. A second electrode is formed by a fifth patterning process. It is reduced by one time of patterning process compared with six times of patterning processes in the prior art, thus reducing the cost.

The embodiments of the present disclosure further provide a display panel, including the array substrate described above.

The display panel may specifically be a liquid crystal display panel.

Further, the embodiments of the present disclosure further provide a display device, which may be any product or part having a display function, such as a mobile phone, a tablet, a television, a display, a notebook computer, a digital photo frame, a navigator, and the like.

The embodiments of the present disclosure provide an array substrate, a manufacturing method thereof, a display panel and a manufacturing method thereof. A gate metal layer including a gate electrode is formed by a first patterning process. A semiconductor layer and a source/drain metal layer including a data line and a metal electrode are formed by a second patterning process. A first electrode is formed and a channel region is formed by a third patterning process. A passivation layer and an organic insulating layer are formed by a fourth patterning process. A second electrode is formed by a fifth patterning process. It is reduced by one time of patterning process compared with six times of patterning processes in the prior art, thus reducing the cost.

The foregoing descriptions are merely specific embodiments of the present disclosure, but the protection scope of the present disclosure is not limited thereto. Changes or substitutions easily conceived by anyone skilled in the art within the technical scope disclosed in the present disclosure should be covered in the protection scope of the present disclosure. Therefore, the protection scope of the present disclosure should be based on the protection scope of the claims.

What is claimed is:

1. A manufacturing method of an array substrate, comprising:
   forming a gate metal layer on a base by a first patterning process;
   forming a gate insulating layer on the gate metal layer;
   forming a semiconductor layer and a source/drain metal layer by a second patterning process on the base formed with the gate metal layer and the gate insulating layer thereon, wherein the source/drain metal layer comprises a data line and metal electrodes connected to the data line;
   forming a first electrode and a channel region by a third patterning process on the base formed with the semiconductor layer and the source/drain metal layer thereon, wherein the channel region forms a source electrode and a drain electrode from the metal electrodes;
   forming a passivation layer and an organic insulating layer by a fourth patterning process on the base formed with the first electrode thereon; the organic insulating layer at least corresponds to the data line; and
   forming a second electrode by a fifth patterning process on the base formed with the organic insulating layer thereon,
   wherein pattern shapes of the semiconductor layer and the source/drain metal layer are identical;
   the step of forming a first electrode and a channel region by a third patterning process comprises:
   forming a conductive film and a photoresist on the base formed with the semiconductor layer and the source/drain metal layer thereon;
   exposing the photoresist using a common mask plate to be developed to form a photoresist retained pattern, wherein the photoresist retained pattern corresponds to the first electrode to be formed, both the source electrode and the drain electrode to be formed, and the data line; and
   etching the substrate using an etching process, such that the metal electrodes form the source electrode and the drain electrode to simultaneously form the first electrode as well as a retained pattern located above the data line, the source electrode and the drain electrode.

2. The manufacturing method according to claim 1, wherein both the first electrode and the second electrode are transparent electrodes.

3. The manufacturing method according to claim 2, wherein the first electrode is a common electrode, and the second electrode is a pixel electrode, the pixel electrode being electrically connected to the drain electrode at least through a via hole provided on the passivation layer, or
   the first electrode is a pixel electrode directly connected to the drain electrode, and
   the second electrode is a common electrode.

4. The manufacturing method according to claim 1, wherein pattern shapes of the semiconductor layer and the source/drain metal layer are identical;
   the step of forming a first electrode and a channel region by a third patterning process comprises:
   forming a conductive film and a photoresist on the base formed with the semiconductor layer and the source/drain metal layer thereon;
   exposing the photoresist using a common mask plate to be developed to form a photoresist retained pattern, wherein the photoresist retained pattern corresponds to the first electrode to be formed, both the source electrode and the drain electrode to be formed, and the data line; and
   etching the substrate using an etching process, such that the metal electrodes form the source electrode and the drain electrode to simultaneously form the first electrode as well as a retained pattern located above the data line, the source electrode and the drain electrode.

5. The manufacturing method according to claim 4, wherein the semiconductor layer comprises an a-si layer and an $n^+$a-si layer,
   the step of etching the substrate using an etching process, such that the metal electrode forms the source electrode and the drain electrode comprises:
   etching the substrate using the etching process, such that the metal electrode forms the source electrode and the drain electrode and the $n^+$a-si layer forms an ohmic contact layer.

6. The manufacturing method according to claim 1, wherein the organic insulating layer corresponds to the data line, the source electrode and the drain electrode, and the channel region.

7. The manufacturing method according to claim 6, wherein the passivation layer has a thickness of 1500~2500 Å; and
   the organic insulating layer has a thickness of 1.5~2.2 μm.

8. The manufacturing method according to claim 1, wherein the organic insulating layer is laid on the base;
   the organic insulating layer comprises a first portion and a second portion, the first portion corresponding to the data line, the source electrode, the drain electrode, and the channel region, and the second portion corresponding to other regions;
   the first portion has a thickness of 1.8~2.7 μm, and the second portion has a thickness of 3000~5000 Å; and
   the passivation layer has a thickness of 500~1000 Å.

9. The manufacturing method according to claim 1, wherein the photosensitive resin fully-retained portion has a thickness of 2.0~3.0 μm; and the photosensitive resin half-retained portion has a thickness of 5000~8000 Å.

10. A manufacturing method of a display panel, comprising the manufacturing method of an array substrate according to claim 1.

11. A manufacturing method of an array substrate comprising,
   forming a gate metal layer on a base by a first patterning process;
   forming a gate insulating layer on the gate metal layer;

forming a semiconductor layer and a source/drain metal layer by a second pattering process on the base formed with the gate metal layer and the gate insulating layer thereon, wherein the source/drain metal layer comprises a data line and metal electrodes connected to the data line;

forming a first electrode and a channel region by a third patterning process on the base formed with the semiconductor layer and the source/drain metal layer thereon, wherein the channel region forms a source electrode and a drain electrode from the metal electrodes;

forming a passivation layer and an organic insulating layer by a fourth patterning process on the base formed with the first electrode thereon; the organic insulating layer at least corresponds to the data line; and forming a second electrode by a fifth patterning process on the base formed with the organic insulating layer thereon, wherein the organic insulating layer is laid on the base;

the organic insulating layer comprises a first portion and a second portion, the first portion corresponding to the data line, the source electrode, the drain electrode, and the channel region, and the second portion corresponding to other regions;

a first portion has a thickness of 1.8~2.7 μm, and the second portion has a thickness of 3000~5000 Å; and the passivation layer has a thickness of 500~1000 Å, wherein the first electrode is a common electrode, and the second electrode is a pixel electrode, the step of forming a passivation layer and an organic insulating layer by a third patterning process comprises:

sequentially forming a passivation film and a photosensitive resin film on the base formed with the first electrode thereon;

exposing the photosensitive resin film using a half-tone mask plate to form a photosensitive resin fully-retained portion, a photosensitive resin half-retained portion and a photosensitive resin completely-removed portion; wherein the photosensitive resin fully-retained portion corresponds to the data line, the source electrode and the drain electrode and the channel region; the completely-removed portion corresponds to a via hole to be formed exposing the drain electrode and the photosensitive resin half-retained portion corresponds to other regions;

etching the passivation film using an etching process to form a passivation layer comprising a via hole, the via hole exposes the drain electrode; and ashing the photosensitive resin fully-retained portion and the photosensitive resin half-retained portion using an ashing process to form the organic insulating layer.

* * * * *